United States Patent
Jeong (10) Patent No.: US 9,151,795 B2
(45) Date of Patent: Oct. 6, 2015

(54) APPARATUS FOR INSPECTING PASSIVE COMPONENT HAVING SIGNAL TRANSMISSION LINE

(71) Applicant: Avago Technologies General IP (Singapore) Pte. Ltd., Singapore (SG)

(72) Inventor: Jin Jeong, Kyunggi province (KR)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 373 days.

(21) Appl. No.: 13/682,970

(22) Filed: Nov. 21, 2012

(65) Prior Publication Data

US 2014/0139233 A1    May 22, 2014

(51) Int. Cl.
*G01R 31/08* (2006.01)
*G01R 31/11* (2006.01)
*G01R 31/28* (2006.01)

(52) U.S. Cl.
CPC ............ *G01R 31/11* (2013.01); *G01R 31/2812* (2013.01); *G01R 31/2813* (2013.01); *G01R 31/2801* (2013.01)

(58) Field of Classification Search
CPC ............... G01R 31/11; G01R 31/2801; G01R 31/2813; G01R 31/2812
USPC ..................... 324/520, 500, 763.01
See application file for complete search history.

(56) References Cited

U.S. PATENT DOCUMENTS

| | | | |
|---|---|---|---|
| 4,538,103 A * | 8/1985 | Cappon ......................... | 324/534 |
| 4,791,351 A * | 12/1988 | Le Traon et al. .............. | 324/646 |
| 5,744,971 A | 4/1998 | Chan et al. | |
| 6,501,278 B1 | 12/2002 | Arabi | |
| 6,922,062 B2 | 7/2005 | Sparkman | |
| 7,098,670 B2 | 8/2006 | Cole | |
| 7,139,668 B2 * | 11/2006 | Bechhoefer ..................... | 702/58 |
| 7,405,575 B2 | 7/2008 | Tan et al. | |
| 7,631,230 B2 * | 12/2009 | Williams ....................... | 714/712 |
| 7,940,061 B2 * | 5/2011 | Focia et al. .................... | 324/700 |
| 8,659,315 B2 * | 2/2014 | Pupalaikis et al. ........ | 324/763.01 |
| 2008/0204040 A1 * | 8/2008 | Muljono ........................ | 324/606 |
| 2013/0181737 A1 * | 7/2013 | Liu et al. ................... | 324/763.01 |

* cited by examiner

*Primary Examiner* — Hoai-An D Nguyen (57) ABSTRACT

An apparatus for inspecting a passive component having a signal transmission line on a printed circuit board (PCB), includes a reflectometry unit for inputting an incident signal to an input port connected to the signal transmission line, receiving a reflected signal in response to the incident signal, and computing a plurality of frequency-based reflection coefficient values in a preset frequency range and a plurality of time-based reflection coefficient values in a preset time range based on the incident signal and the reflected signal; and a defect detection unit for determining whether the signal transmission line has a defect based on the plurality of frequency-based reflection coefficient values, and determining a location of the defect on the signal transmission line based on the plurality of time-based reflection coefficient values.

20 Claims, 5 Drawing Sheets

APPARATUS FOR INSPECTING PASSIVE COMPONENT HAVING SIGNAL TRANSMISSION LINE

BACKGROUND

The inventive concepts described herein are generally related to an apparatus for inspecting a passive component having a signal transmission line, and more particularly to an apparatus for determining whether a passive component having a signal transmission line has a defect and determining the location of the defect.

Passive components generally refer to components that transfer, accumulate or consume power supplied from other components connected thereto. Passive components typically do not actively amplify or rectify supplied power. A surface-mounted device (SMD)-type element having a width and a height, such as an inductor or a capacitor mounted on a surface of a printed circuit board (PCB), is typically employed as a passive component in a low frequency band. However, since the width and the height of an SMD-type element may tend to exert influence on the inductance or capacitance of the SMD-type element when employed in a high frequency band such as a radio frequency (RF) band, the SMD-type element my have an actual inductance or capacitance value different from its designed value.

Accordingly, instead of an SMD-type element, a signal transmission line, e.g., a microstrip embedded in a PCB, may be employed as a passive component in the RF band. A passive component consisting of a signal transmission line, e.g., an RF passive component, may be manufactured to have a desired inductance or capacitance by embedding the signal transmission line in the PCB in various shapes. Examples of passive components that are made of shaped embedded signal transmission lines include a meander inductor, a spiral inductor, a rectangular shunt capacitor and a fan-shaped shunt capacitor respectively illustrated in FIGS. 6(a) to 6(d).

However, since a thickness of a signal transmission line embedded in a PCB may be limited, the signal transmission line may be subjected to deformation or defects during the fabrication. When such a defect occurs in an RF passive component, an actual impedance of the RF passive component may be different from an intended impedance, thereby compromising system efficiency of a circuit employing the defective RF passive component. It has thus become necessary and desirable to inspect RF passive components after fabrication to determine whether the signal transmission line forming the RF passive component has any defects.

Conventionally, an X-ray inspection method has been used for such purposes. An X-ray inspection method is typically performed by irradiating X-rays onto a fabricated RF passive component, acquiring an X-ray image of the RF passive component, visually inspecting the RF passive component with an unaided eye based on the acquired image, and then intuitively determining without the benefit of any scientific measure whether the signal transmission line has any defects.

Consequently, conventional X-ray inspection methods take an excessively long time, and are often inaccurate since visual inspection is performed with an unaided eye.

Therefore, there has been a need to develop an apparatus capable of inspecting a passive component having a signal transmission line efficiently and accurately.

SUMMARY

In accordance with a representative embodiment, there is provided an apparatus for inspecting a passive component having a signal transmission line on a printed circuit board (PCB), including a reflectometry unit configured to input an incident signal to an input port connected to the signal transmission line, receive a reflected signal in response to the incident signal through the input port, and compute a plurality of frequency-based reflection coefficient values in a preset frequency range and a plurality of time-based reflection coefficient values in a preset time range based on the incident signal and the reflected signal; and a defect detection unit configured to determine whether the signal transmission line has a defect based on the plurality of frequency-based reflection coefficient values, and determine a location of the defect on the signal transmission line based on the plurality of time-based reflection coefficient values.

In accordance with a further representative embodiment, there is provided an apparatus for inspecting a passive component having a signal transmission line on a printed circuit board (PCB), including a reflectometry unit configured to input an incident signal to an input port connected to the signal transmission line, receive a reflected signal in response to the incident signal through the input port, and compute a plurality of frequency-based reflection coefficient values in a preset frequency range based on the incident signal and the reflected signal; and a defect detection unit configured to determine whether the signal transmission line has a defect based on the plurality of frequency-based reflection coefficient values.

BRIEF DESCRIPTION OF THE DRAWINGS

The example embodiments are best understood from the following detailed description when read when read with the accompanying drawing figures. Whenever applicable and practical, like reference numbers refer to like elements

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

The configuration of an apparatus 100 for inspecting an RF passive component in accordance with representative embodiments will be described with reference to FIG. 1.

Figure 1:
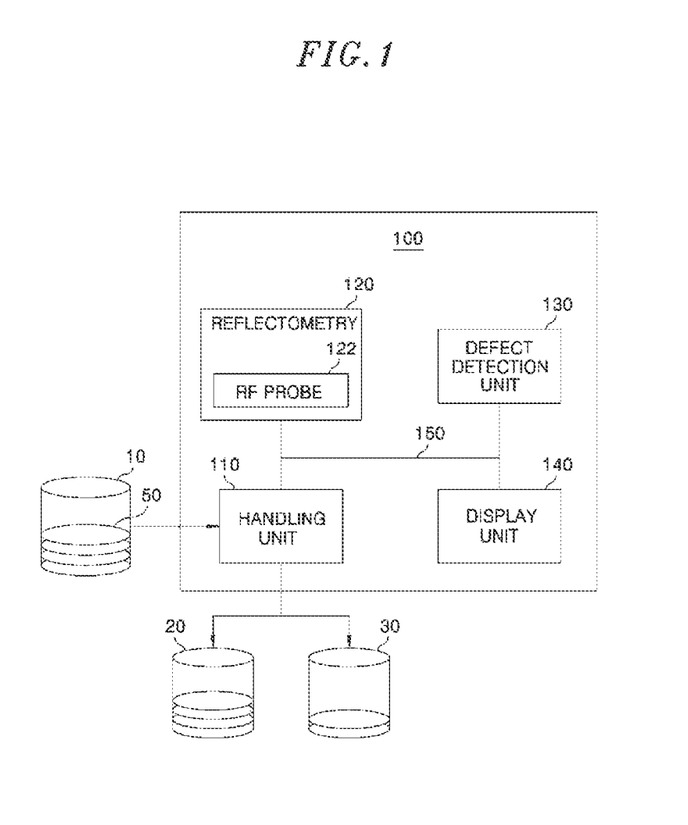
FIG. 1 is a schematic block diagram illustrating the configuration of an apparatus for inspecting an RF passive component according to a representative embodiment.

FIG. 1 is a schematic block diagram illustrating the configuration of an apparatus for inspecting an RF passive component according to a representative embodiment.

Referring to FIG. 1, the apparatus 100 for inspecting an RF passive component may include a handling unit 110, a reflectometry unit 120, a defect detection unit 130, a display unit 140, and an interface unit 150.

The handling unit 110 may handle a printed circuit board (PCB) 50, including at least one passive component (hereinafter referred to as the "RF passive component") that is embodied by embedding a signal transmission line, such as a microstrip, in and/or on a PCB. For example, the handling unit 110 may take the PCB 50 out of an incoming cassette 10 in which a plurality of PCBs has been stacked, and then place the PCB 50 on a holder (such as holder 40 shown in FIG. 3). After inspection of the PCB 50 is complete, the handling unit 110 may remove the PCB 50 from the holder 40, and may carry and place the PCB 50 into any one of the outgoing cassettes 20 and 30 depending on the results of the inspection.

The reflectometry unit 120 may input an incident signal to the signal transmission line that constitutes the RF passive component and receive a reflected signal in response to the incident signal, using an RF probe 122. The reflectometry unit 120 may compute a plurality of frequency-based reflection coefficient values in a preset frequency range and a plurality of time-based reflection coefficient values in a preset time range based on the incident and reflected signals. The reflectometry unit 120 may be, for example, a network analyzer.

The defect detection unit 130, which may include a processor or the like, may determine whether the signal transmission line has a defect based on the frequency-based reflection coefficient values computed by the reflectometry unit 120. In an embodiment, the defect detection unit 130 may also determine a location of a defect on the signal transmission line based on the time-based reflection coefficient values.

The display unit 140 may receive data indicative of the frequency-based reflection coefficient values and/or the time-based reflection coefficient values from the reflectometry unit 120, and may display the data so that an inspector can check the data.

The interface unit 150 interconnects the handling unit 110, the reflectometry unit 120, the defect detection unit 130, and the display unit 140, and may be general purpose interface bus (GPIB) for example. Data may be exchanged between the handling unit 110, the reflectometry unit 120, the defect detection unit 130, and the display unit 140 through the interface unit 150.

The operation of the apparatus 100 for inspecting an RF passive component in accordance with the embodiment of a representative embodiment will be described in greater detail below with reference to FIGS. 1 to 5.

Figure 2:
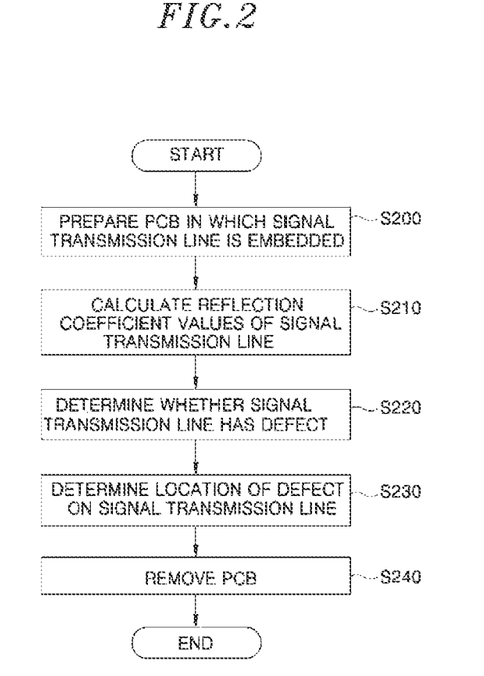
FIG. 2 is a flow chart illustrating a method of inspecting an RF passive component according to a representative embodiment.
Figure 3:
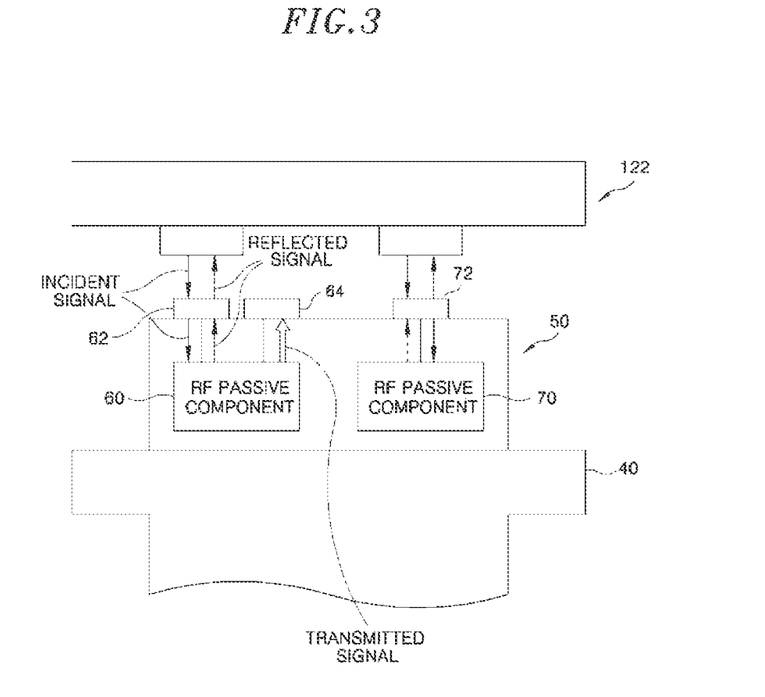
FIG. 3 is a schematic view illustrating a configuration of a reflectometry unit for measuring reflection coefficient values of an RF passive component according to a representative embodiment.

FIG. 2 is a flow chart illustrating a method of inspecting an RF passive component according to a representative embodiment. FIG. 3 is a schematic view illustrating a configuration of a reflectometry unit for measuring reflection coefficient values of an RF passive component according to a representative embodiment.

First, a PCB having an embedded signal transmission line is prepared for inspection at step S200 in FIG. 2.

For example, the handling unit 110 may take a PCB 50 from the incoming cassette 10 and place the PCB 50 on the holder 40. As shown in FIG. 3, the PCB 50 placed on the holder 40 may include an RF passive component 60 and an input port 62 connected to the RF passive component 60. Examples of the RF passive component 60 include an impedance matching network, an antenna, a coupler, and a duplexer. The RF passive component 60 is embodied by embedding a signal transmission line in the PCB 50, that is, the RF passive component 60 includes a signal transmission line in and/or on the PCB 50. Once preparations for inspection of the RF passive component 60 have been completed in such a way that the handling unit 110 places the PCB 50 on the holder 40, a signal indicative of the completion may be transferred to the reflectometry unit 120 via the interface unit 150.

Thereafter, reflection coefficient values of the signal transmission line are calculated at step S210 in FIG. 2.

As shown in FIG. 3, the reflectometry unit 120 may input a broadband-frequency incident signal to the input port 62 of the RF passive component 60 using the RF probe 122. Part of the incident signal inputted to the RF passive component 60 is transmitted to another port 64 as a transmitted signal, and part of the transmitted signal is reflected and returned to the input port 62 as a reflected signal. The reflectometry unit 120 receives a reflected signal in response to the incident signal from the input port 62 via the RF probe 122.

Figure 4:
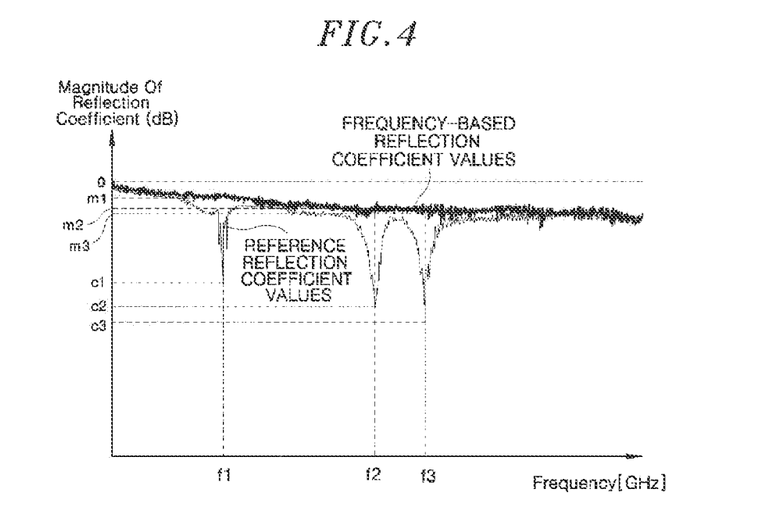
FIG. 4 is a graph depicting frequency-based reflection coefficient values computed according to as representative embodiment.
Figure 5:
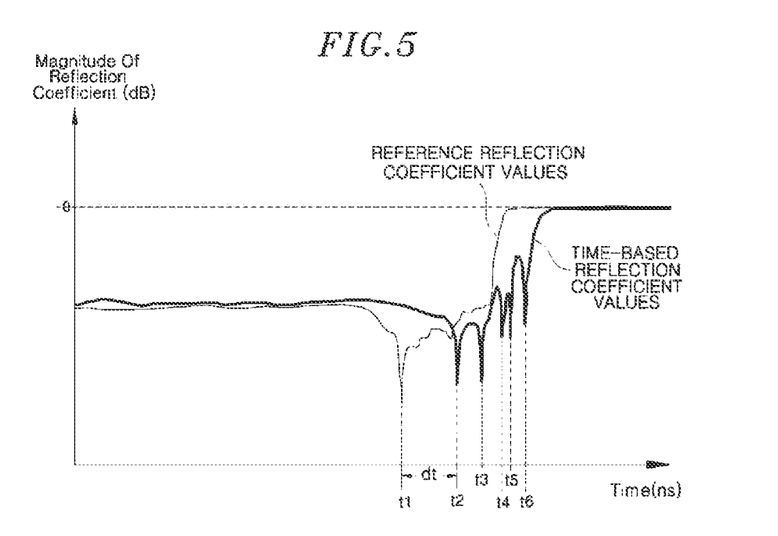
FIG. 5 is a graph depicting time-based reflection coefficient values computed according to a representative embodiment.
Figure 6:
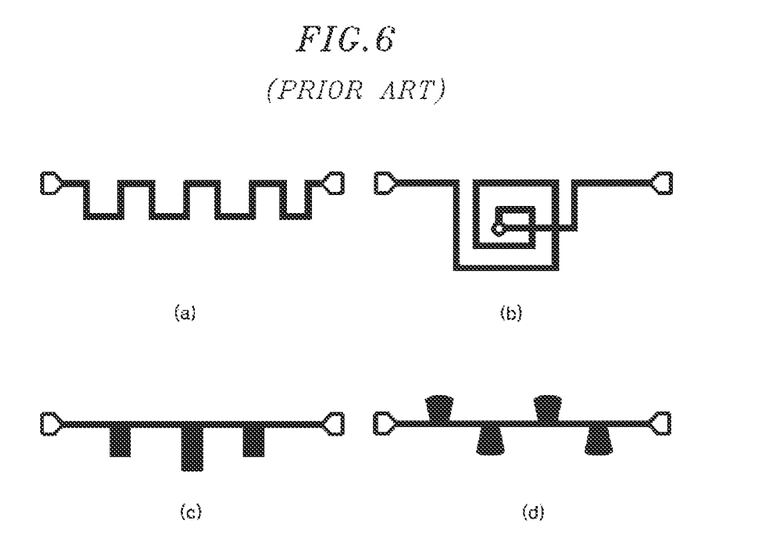
FIG. 6 is a schematic view illustrating exemplary shapes of signal transmission lines employed as RF passive components.

Based on the reflected and incident signals, the reflectometry unit 120 may compute the reflection coefficients in the frequency domain, i.e., frequency-based reflection coefficient values, and may compute the reflection coefficients in the time domain, i.e., time-based reflection coefficient values. In some embodiments, the reflectometry unit 120 may first compute the frequency-based reflection coefficient values, and may then obtain the time-based reflection coefficient values by performing an inverse Fourier transform on the frequency-based reflection coefficient values. For example, frequency-based reflection coefficient values in the frequency domain may be computed, as shown in FIG. 4, and the time-based reflection coefficient values in the time domain may be computed, as shown in FIG. 5.

In some embodiments, as shown in FIG. 3, a single PCB 50 may include a plurality of RIP passive components 60 and 70. In this case, the reflectometry unit 120 may simultaneously inspect the plurality of RF passive components 60 and 70 using the RF probe 122. For example, it may be possible to input the same incident signal to the input ports 62 and 72 of the plurality of RF passive components 60 and 70, to receive reflected signals attributable to responses to the incident signals from the input ports 62 and 72, and to compute the frequency-based reflection coefficient values and the time-based reflection coefficient values for each of the RF passive components 60 and 70.

Data of the frequency-based reflection coefficient values and the time-based reflection coefficient values, which were computed by the reflectometry unit 120, is transmitted to the defect detection unit 130 and/or the display unit 140 via the interface unit 150.

Thereafter, it is determined whether the signal transmission line constituting the RF passive component has a defect at step S220 in FIG. 2.

The defect detection unit 130 may determine whether the signal transmission line that constitutes the RF passive component 60 has a defect based on the frequency-based reflection coefficient values, which were computed by the reflectometry unit 120. In some embodiments, the existence of a defect in the signal transmission line may be determined by comparing the computed frequency-based reflection coefficient values with reference reflection coefficient values. For example, the reference reflection coefficient values may be values that were computed for the RF passive component having no defect, or that were obtained by simulations during the design of the RF passive component.

In some embodiments, the defect detection unit 130 selects at least one specific frequency within a preset frequency range, and acquires at least one reference reflection coefficient value of the passive component at the specific frequency while referring to the frequency-based reflection coefficient values. Then, the defect detection unit 130 calculates a difference between the reference reflection coefficient value and a reflection coefficient value at the specific frequency among the frequency-based reflection coefficient values. Thereafter, the defect detection unit 130 determines whether the calculated difference falls within a preset numerical range. For example, if a ratio of the difference to the reference reflection coefficient value is smaller than a threshold value, the defect detection unit 130 may determine that the signal transmission line has no defect. In contrast, if the ratio is equal to or greater than the threshold value, the defect detection unit 130 may determine that the signal transmission line has a defect.

Referring to FIG. 4, the defect detection unit 130 may select the frequencies f1, f2, and f3, and acquire reference reflection coefficient values c1, c2, and c3. Then, the defect detection unit 130 may calculate differences between the reference reflection coefficient values c1, c2, and c3 and reflection coefficient values m1, m2, and m3 at the selected frequencies f1, f2, and f3, respectively. Thereafter, if the ratios of the differences to the reference reflection coefficient values c1, c2, and c3 are smaller than a threshold value, the defect detection unit 130 determines that the signal transmission line has no defect. In contrast, if any one of the ratios are equal to or greater than the threshold value, the defect detection unit 130 determines that the signal transmission line has a defect.

In another embodiment, the defect detection unit 130 may select at least one specific reflection coefficient value from the plurality of frequency-based reflection coefficient values, and acquire at least one reference frequency of the passive component at the specific reflection coefficient value. Then, the defect detection unit 130 may calculate a difference between the reference frequency and a frequency with respect to the specific reflection coefficient value. Thereafter, the defect detection unit 130 may determine the if difference falls within a preset numerical range. For example, if a ratio of the difference to the reference frequency is smaller than a threshold value, the defect detection unit 130 may determine that the signal transmission line has no defect. In contrast, if the ratio is equal to or greater than the threshold value, the defect detection unit 130 may determine that the signal transmission line has a defect. Here, the selected specific reflection coefficient value may be, for example, an extremal value, i.e., a local maximum/minimum value.

In another embodiment, the defect detection unit 130 may compute similarity between the plurality of frequency-based reflection coefficient values and reference reflection coefficient values, and may determine whether a signal transmission line is defective based on the computed similarity. For example, the similarity may be computed by using a variety of well-known statistical methods.

Data on whether the signal transmission line has a defect may be transferred to the display unit 140 via the interface unit 150, and may be displayed so that an inspector can check the data. Furthermore, the data on whether the signal transmission line has a defect may be used later to solve problems that occurred during the fabrication of the RF passive component.

Thereafter, a location of a defect on the signal transmission line may be determined at step S230 shown in FIG. 2.

The defect detection unit 130 may determine the defective point of the signal transmission line based on the time-based reflection coefficient values, which were computed by the reflectometry unit 120. In some embodiments, the defect detection unit 130 may determine the location of the defect on the signal transmission line by comparing the computed time-based reflection coefficient values with reference time values. For example, the reference time values may be values that were computed for the RF passive component having no defect, or that were obtained by simulations during the design of the RF passive component.

In some embodiments, the defect detection unit 130 may obtain a time-based extremal reflection coefficient value from the time-based reflection coefficient values. Then, the defect detection unit 130 may acquire a reference time value of the passive component. Thereafter, the defect detection unit 130 may compute the time difference dt between the obtained time-based extremal reflection coefficient value and the acquired reference time value, and convert the computed time difference dt into a distance difference. Here, the obtained distance difference corresponds to the distance from the input port 62 of the RF passive component 60 to the location of the defect on a signal transmission line, and thus the location thereof may be determined based on the distance difference.

Referring to FIG. 5, the defect detection unit 130 may obtain a time value t2 at which the magnitude of the reflection coefficient in time domain is extremal, and compute the time difference dt between the Obtained time value t2 and a reference time value t1 of the passive component. In one embodiment, if there is a plurality of time values t2, t3, t4, t5, and t6 at which each of the magnitudes of the reflection coefficients are extremal, the minimum time value t2 may be selected from among the plurality of time values t2, t3, t4, t5, and t6. Thereafter, the defect detection unit 130 may compute a distance difference by multiplying the computed time difference by the speed constant of light c, and determine the location of the defect on signal transmission line based on the computed distance difference.

Data about the location of the defect on the signal transmission line may be transferred to the display unit 140 via the interface unit 150, and may be displayed so that an inspector can check the data. Furthermore, the data about the location of the defect may be used later to solve problems that occurred during the fabrication of the RF passive component.

Thereafter, the PCB is removed at step S240 in FIG. 2.

The handling unit 110 may remove the inspected PCB 50 from the holder 40, and may carry it into any one of the outgoing cassettes 20 and 30 depending on the results of the inspection.

In accordance with the above-described representative embodiments, determination of whether an RF passive component has a defect and where the defect is located is determined based on the frequency-based and time-based reflection coefficient values obtained for the signal transmission line of the RF passive component, rather than on a conventional X-ray image of the signal transmission line of the RF passive component. The RF passive component can thus be inspected more rapidly and efficiently. Additionally, the distance from the input port of the RF passive component to the defective point of the signal transmission line may be calculated, and thus the defective point can be determined more accurately.

Meanwhile, although operation of inspecting at least one RF passive component embodied in a single PCB has been described, it will be apparent that a plurality of PCBs can be rapidly and automatically inspected by repeatedly performing the above operation on at least one RF passive component of each of the plurality of PCBs.

Furthermore, although the above-described operations have been described as being performed by hardware, it will be apparent that the above-described operations may be implemented using software or an application that can be executed by a processor, a computer, or a terminal and that can be stored in a computer-readable storage medium.

While representative embodiments have been shown and described with respect to the corresponding figures, they are intended to be illustrative and should be interpreted in a non-restrictive manner. Moreover, it should be understood by those skilled in the art that various changes and modifications may be made without departing from the spirit and scope of the invention as defined in the following claims.

What is claimed is:

1. An apparatus for inspecting a passive component having a signal transmission line on a printed circuit board (PCB), comprising:
    a reflectometry unit configured to input an incident signal to an input port connected to the signal transmission line, receive a reflected signal in response to the incident signal through the input port, and compute a plurality of frequency-based reflection coefficient values in a preset frequency range and a plurality of time-based reflection coefficient values in a preset time range based on the incident signal and the reflected signal; and
    a defect detection unit configured to determine whether the signal transmission line has a defect based on the plurality of frequency-based reflection coefficient values, and determine a location of the defect on the signal transmission line based on the plurality of time-based reflection coefficient values.

2. The apparatus of claim 1, wherein the defect detection unit configured to select a specific frequency within the preset frequency range; acquire a reference reflection coefficient value of the passive component at the specific frequency; calculate a difference between the reference reflection coefficient value and a reflection coefficient value at the specific frequency from among the plurality of frequency-based reflection coefficient values; and determine that the signal transmission line has a defect if a ratio of the difference to the reference reflection coefficient value is equal to or greater than a threshold value.

3. The apparatus of claim 1, wherein the defect detection unit is configured to select a specific reflection coefficient value from the plurality of frequency-based reflection coefficient values; acquire a reference frequency of the passive component at the specific reflection coefficient value; calculate a difference between the reference frequency and a frequency corresponding to the specific reflection coefficient value; and determine that the signal transmission line has a defect if a ratio of the difference to the reference frequency is equal to or greater than a threshold value.

4. The apparatus of claim 1, wherein the defect detection unit is configured to acquire reference reflection coefficient values of the passive component within the preset frequency range; calculate a similarity between the reference reflection coefficient values and the plurality of frequency-based reflection coefficient values; and determine whether the signal transmission line has a defect based on the calculated similarity.

5. The apparatus of claim 1, wherein the defect detection unit is configured to obtain a time-based extremal reflection coefficient value from the plurality of time-based reflection coefficient values; acquire a reference time value of the passive component within the preset time range; calculate a difference between the reference time value and a time value corresponding to the time-based extremal reflection coefficient value; and determine a distance from the input port to the location of the detect on the signal transmission line based on the difference.

6. The apparatus of claim 5, wherein the defect detection unit is configured to determine the distance by multiplying the difference between the reference time value and the time value corresponding to the extremal reflection coefficient value by a speed constant of light.

7. The apparatus of claim 1, wherein the reflectometry unit is configured to calculate the plurality of time-based reflection coefficient values by performing an inverse Fourier transform on the plurality of frequency-based reflection coefficient values.

8. The apparatus of claim 1, further comprising a display unit configured to receive data on the plurality of frequency-based reflection coefficient values or the plurality of time-based reflection coefficient values from the reflectometry unit, and to display the data.

9. The apparatus of claim 1, further comprising a handling unit for handling the PCB on which the signal transmission line is included.

10. The apparatus of claim 1, wherein the reflectometry unit is a network analyzer.

11. The apparatus of claim 1, wherein the passive component is of an impedance matching network.

12. An apparatus for inspecting a passive component having a signal transmission line on a printed circuit board (PCB), comprising:
    a reflectometry unit configured to input an incident signal to an input port connected to the signal transmission line, receive a reflected signal in response to the incident signal through the input port, and compute a plurality of frequency-based reflection coefficient values in a preset frequency range based on the incident signal and the reflected signal; and
    a detect detection unit configured to determine whether the signal transmission line has a defect based on the plurality of frequency-based reflection coefficient values.

13. The apparatus of claim 12, wherein the defect detection unit is configured to select a specific frequency within the preset frequency range; acquire a reference reflection coefficient value of the passive component at the specific frequency; calculate a difference between the reference reflection coefficient value and a reflection coefficient value at the specific frequency from among the plurality of frequency-based reflection coefficient values; and determine that the signal transmission line has a defect if a ratio of the difference to the reference reflection coefficient value is equal to or greater than a threshold value.

14. The apparatus of claim 12, wherein the defect detection unit is configured to select a specific reflection coefficient value from the plurality of frequency-based reflection coefficient values; acquire a reference frequency of the passive component at the specific reflection coefficient value; calculate a difference between the reference frequency and a frequency corresponding to the specific reflection coefficient value; and determine that the signal transmission line has a defect if a ratio of the difference to the reference frequency is equal to or greater than a threshold value.

15. The apparatus of claim 12, wherein the defect detection unit is configured to acquire reference reflection coefficient values of the passive component within the preset frequency range; calculate a similarity between the reference reflection coefficient values and the plurality of frequency-based reflection coefficient values; and determine whether the signal transmission line has a defect based on the calculated similarity.

16. The apparatus of claim 12, wherein the reflectometry unit is further configured to compute a plurality of time-based reflection coefficient values in a preset time range based on the incident signal and the reflected signal, and wherein the defect detection unit is further configured to determine a location of the defect on the signal transmission line based on the plurality of time-based reflection coefficient values.

17. The apparatus of claim 16, wherein the defect detection unit is configured to obtain a time-based extremal reflection coefficient value from the plurality of time-based reflection coefficient values; acquire a reference time value of the passive component within the preset time range; calculate a difference between the reference time value and a time value corresponding to the time-based extremal reflection coefficient value; and determine a distance from the input port to the location of the detect on the signal transmission line based on the difference.

18. The apparatus of claim 17, wherein the defect detection unit is configured to determine the distance by multiplying the difference between the reference time value and the time value corresponding to the extremal reflection coefficient value by a speed constant of light.

19. The apparatus of claim 16, wherein the reflectometry unit is configured to calculate the plurality of time-based reflection coefficient values by performing an inverse Fourier transform on the plurality of frequency-based reflection coefficient values.

20. The apparatus of claim 12, wherein the reflectometry unit is a network analyzer.

* * * * *